May 30, 1967 J. C. MACKELLAR 3,323,001

TIME-BASE CIRCUIT ARRANGEMENT HAVING TRANSISTOR AND SCR SWITCHING ELEMENTS

Filed Nov. 13, 1963 2 Sheets-Sheet 1

INVENTOR.
JOHN C. MACKELLAR
BY
Frank R. Jifon
AGENT

May 30, 1967 J. C. MACKELLAR 3,323,001

TIME-BASE CIRCUIT ARRANGEMENT HAVING TRANSISTOR AND SCR SWITCHING ELEMENTS

Filed Nov. 13, 1963 2 Sheets-Sheet 2

INVENTOR.
JOHN C. MACKELLAR
BY
Frank R. Trifari
AGENT

United States Patent Office 3,323,001

Patented May 30, 1967

3,323,001

TIME-BASE CIRCUIT ARRANGEMENT HAVING TRANSISTOR AND SCR SWITCHING ELEMENTS

John Campbell Mackellar, East Grinstead, England, assignor to North American Philips Company, Inc., New York, N.Y., a corporation of Delaware Filed Nov. 13, 1963, Ser. No. 323,433

Claims priority, application Great Britain, Dec. 28, 1962, 48,829/62

11 Claims. (Cl. 315—27)

This invention relates to time-base circuit arrangements for generating a saw-tooth deflection current in a deflection coil. More particularly, the invention relates to a deflection circuit comprising two switching elements of the semiconductor type, a source of supply voltage having two terminals, drive means for delivering signals to turn on and off at least one of said two switching elements, an overswing coil and a supply impedance. The first switching element is connected in series with an inductive load, formed by said deflection coil, across the two terminals of said supply source. The second switching element is connected in series with said overswing coil and said supply impedance across said two terminals of said source, but in such a manner that the free end of the series connection of the second switching element and overswing coil is connected to the other terminal of the supply source as the first switching element. An A.C. coupling is connected between the first switching element-to-inductive load junction and the supply imedance-to-overswing coil, second switching element junction.

Such a time-base circuit arrangement is already proposed in U.S. Patent No. 3,229,150.

In this proposed circuit arrangement, the first switching element is a diode which is turned on when the second switching element, a silicon controlled rectifier (SCR) is turned off automatically, and turned off when the second switching element is turned on by means of a drive signal. This on and off switching of the diode is accomplished by means of voltages developed in the time-base circuit arrangement itself. Especially at the instant the diode is turned off a large blocking voltage is developed across said diode (this blocking voltage jumps directly to said large value after the turn-off instant).

Due to the hole storage effect in the diode this blocking voltage causes an inverse current to flow, so that directly after the turning-off instant a large blocking voltage is developed across the diode and an inverse current is flowing so that the diode must be able to withstand a large dissipation.

In order to overcome said difficulty, the circuit arrangement in accordance with the present invention is characterized in that the first switching element is a transistor connected in its forward direction with respect to the polarity of the voltage delivered by the supply source, and the second switching element is a controlled rectifier connected in its backward direction with respect to the polarity of the voltage delivered by the supply source. The drive means deliver a first drive signal to turn off the transistor before the end of a scanning stroke and turn it on at the beginning of the scanning stroke and a second drive signal to turn on said controlled rectifier at the instant the transistor is turned off.

As will be seen, when comparing the drawings of the present application and that of U.S. Patent No. 3,229,150, the whole process is reversed. This means that the transistor-current is taken over by the SCR-current and that, after the transistor-current is reduced to zero, the voltage across it rises, but slowly, so that even when the transistor-current is not completely zero at the instant the voltage across it is rising, the transistor dissipation is still low.

In order that the invention may readily be carried into effect, an embodiment of a line time-base circuit arrangement with two controlled switching elements in accordance with the invention will now be described by way of example, with reference to the accompanying drawings, in which.

Figure 1:
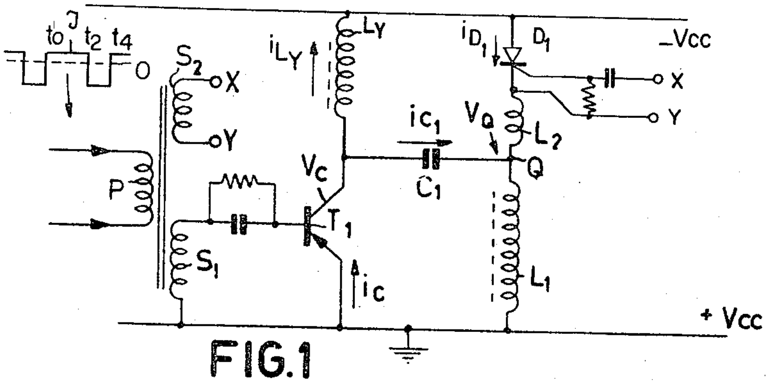
FIG. 1 shows an embodiment without an EHT transformer.

Referring now to FIG. 1, the arrangement described is suitable for use as a line time-base for a television receiver employing magnetic deflection. This circuit arrangement supplies a saw-tooth current waveform to an inductive load constituted by deflection coils $L_y$. The arrangement comprises, as the first switching element, a switching transmsistor $T_1$ having its emitter-collector path in series with said load $L_y$ across a pair of D.C. supply rails, one grounded and one at a voltage $-V_{cc}$. A silicon controlled rectifier (SCR) $D_1$, serving as the second switching element, is connected in series with an overswing coil $L_2$ and with an inductance $L_1$, which serves as the supply impedance, across said rails with the inductance $L_1$ connected to the same rail as the transistor $T_1$. An A.C. coupling $C_1$ is provided between the transistor-to-load junction and the inductance to overswing coil junction Q. It will be clear, however, that SCR $D_1$ and overswing coil $L_2$ can be interchanged, without changing the behaviour of the circuit arrangement.

The capacitance of capacitor $C_1$ constitutes, with the inductance of the load $L_y$ and of the overswing coil $L_2$, a tuned circuit having a period equal, or approximately equal, to four times the desired flyback period.

The controlled rectifier $D_1$ is a trigger device. The overswing coil $L_2$ is necessary in the circuit because it enables the transistor current to be taken over by the controlled rectifier current from the moment the transistor is turned off. In this example the arrangement includes, as will be seen, drive means consisting of a transformer comprising a primary winding P and two secondary windings $S_1$ and $S_2$. The secondary winding $S_1$ is connected through an R.C.-network between the base and emitter electrodes of transistor $T_1$. The secondary winding $S_2$ is connected betwen two points X and Y which, through a further R.C.-network, are coupled to the cathode and control electrodes of rectifier $D_1$. To the primary winding P are applied impulses I. These impulses I induce in the secondary winding $S_1$ impulses which urge transistor $T_1$ to draw current from instant $t_0$ to instant $t_2$ (see also FIG. 2) and induce impulses in the secondary winding $S_2$ for turning the SCR on at the instant $t_2$ (FIG. 2) prior to the end of the scanning time ($t_3$) by a signal applied between its cathode and control or base electrode. It will be clear, however, that a transistor also could be used for the second switching element $D_1$, but in that case the impulses at the secondary winding $S_2$ must also turn off this second transistor. Then difficulties occur due to the fact, as will be explained hereinafter, that the current through the second switching element must increase from the instant $t_2$ to the instant $t_3$ and thereafter decrease. This means that the impulses applied to the second switching element must be able to decrease the current through it from the instant $t_3$. However, the impulses I applied to the primary winding must be of such a form that they, when induced in secondary winding $S_1$, are able to begin with a turn-off of transistor $T_1$ at the instant $t_2$, and to hold this transistor in a turned-off condition until the instant $t_4$. This means the impulses I must have one polarity from instant $t_0$ to $t_2$ and the other polarity from instant $t_2$ to $t_4$ as shown in FIG. 1, in which the broken line indicates ground potential.

When however, rectifier $D_1$ should be replaced by a transistor impulses I should have one polarity from instant $t_2$ to $t_3$ and of the other polarity from instant $t_3$ to the next instant $t_2$. So special impulses would be needed for the second switching element. In the case where a SCR is used, it is only necessary to turn-on the SCR at the instant $t_2$ because its turn-off is accomplished automatically.

The operation of the circuit will now be explained with the aid of FIG. 2 in which FIG. 2(*a*) represents the collector current ($I_c$), FIG. 2(*b*) the emitter-collector voltage ($V_c$) of the transistor $T_1$, FIG. 2(*c*) the voltage $V_Q$ at the junction point Q and FIG. 2(*d*) the current $i_{D1}$ through the rectifier $D_1$.

At the start of the scanning period $t_0$ a negative going drive pulse is applied to the base of transistor $T_1$ with such amplitude as to cause the transistor $T_1$ to bottom so that a substantially linearly increasing current flows through $T_1$ (and $L_y$) throughout the major part $t_0$–$t_2$ of the stroke or scanning period.

Simultaneously with the circuit $L_y$–$T_1$, a separate circuit is operated in the period $t_0$–$t_2$, namely the circuit $T_1$–$C_1$–$L_1$. In this circuit $C_1$ and $L_1$ act as a tuned circuit having a very long period (long when compared with the period $t_0$–$t_2$) whose value is not at all critical. At the start of the scan, the capacitor $C_1$ will be assumed to be charged, the polarity being negative on the transistor side and positive on the other. During the stroke period this capacitor discharges resonantly through $T_1$ and the inductance $L_1$ and, when this discharge is completed at some instant between $t_0$ and $t_1$, the voltage across $C_1$ (and $L_1$) will pass through zero and then change sign (see FIG. 2*c* instant $t_z$). At a later instant $t_1$ this voltage will have risen in resonant manner to a value equal to the supply voltage $-V_{cc}$. At this instant, the SCR (which has been in the off-state) has its reverse anode-cathode voltage reduced to zero. From $t_1$–$t_2$ the voltage across $C_1$ continues to rise and thus forward biases the SCR in anticipation of the trigger pulse to be obtained from winding $S_2$. Since $T_1$ is bottomed by means of the pulses from winding $S_1$, it acts virtually as a direct connection to ground. These latter changes can conveniently be followed as changes in the voltage at point Q as represented in FIG. 2(*c*) (the curvature of the sine-wave is only slightly visible, at instanst $t_0$, due to the very long period of $L_1$–$C_1$). The region in which this voltage exceeds $V_{cc}$ (i.e. $t_1$–$t_2$) represents forward anode-cathode bias for the SCR.

The desired duration of the scanning stroke extends further than instant $t_2$, namely up to instant $t_3$. However, in order to anticipate the effect of hole storage in $T_1$, and in accordance with the invention, transistor $T_1$ is turned off at an instant $t_2$ sufficiently early to allow the collector current and hole storage to have decayed to a negligible level at the instant $t_3$. The SCR is triggered into conduction at the same instant $t_2$ by a signal derived from the drive waveform via connections X–Y. So another circuit path is opened, namely that through capacitor $C_1$, load $L_y$, rectifier $D_1$ and completed through overswing coil $L_2$.

This last circuit path is called the commutation circuit because the charge of capacitor $C_1$ is commutated into a discharge at the instant $t_2$. The commutating current flowing through this commutation circuit enables the current in transistor $T_1$ to reduce to zero at the instant $t_3$, because after the transistor current has been reduced to zero the discharge current can continue to flow through said commutation circuit. Thus the current through transistor $T_1$ is taken over in a so-called take-over period by the commutation circuit.

Figure 2:
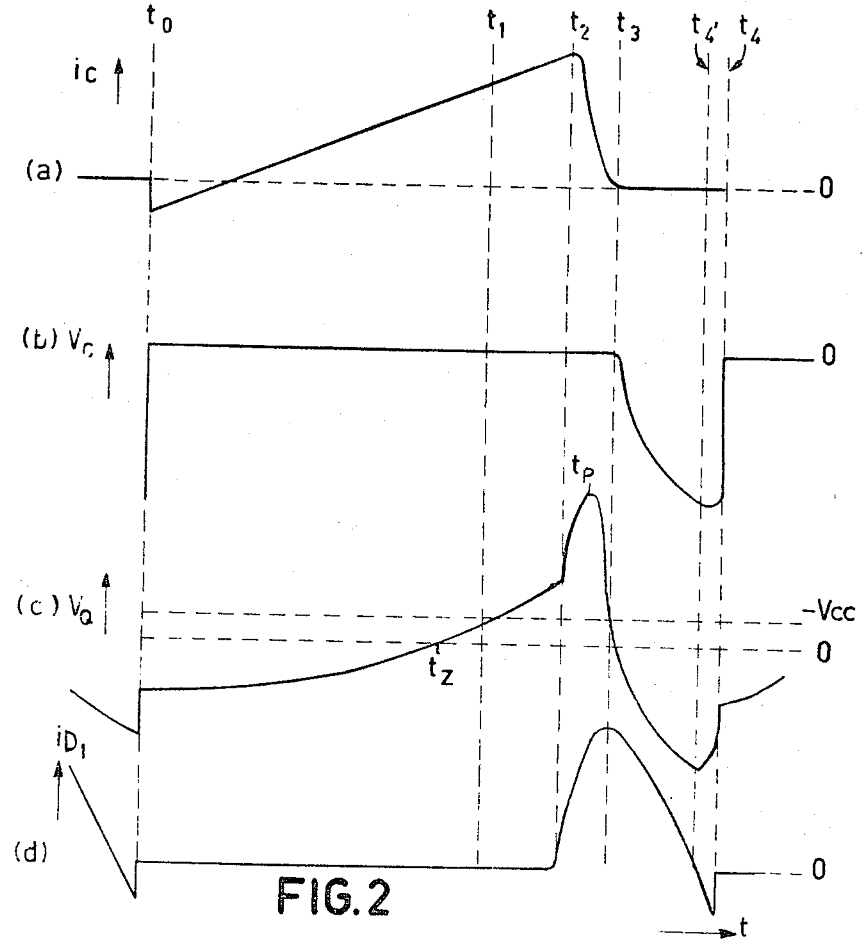
FIG. 2 shows curves of voltages and currents occurring in the embodiment of FIG. 1.

The decay of current in transistor $T_1$ during said take-over period ($t_2$–$t_3$) is shown in FIG. 2(*a*) to occur as a half cycle of a sine-wave. This is due to resonance of $L_2$ and $C_1$, $L_2$ having a small value chosen accordingly.

At some instant during the take-over period it is necessary to turn transistor $T_1$ off at its base, and to maintain this base turn-off voltage up to the end ($t_4$) of the flyback period. In this example the turn-off instant chosen, for convenience, is the instant $t_2$ since this allows the same drive waveform to be used to also turn on the SCR. The SCR $D_1$ is turned off automatically as will be explained more fully hereinafter.

Up to instant $t_2$, the stroke current $i_{Ly}$ has been rising substantially linearly. During $t_2$–$t_3$ the transistor $T_1$ remains conductive and therefore its collector electrode is substantially at ground potential. Thus the D.C. supply voltage $V_{cc}$ is still applied across load $L_y$ and the stroke current therein continues to rise up to instant $t_3$ as desired.

As mentioned above the initial discharge of capacitor $C_1$ is completed at the instant $t_z$, when the voltage across this capacitor is zero. Thereafter capacitor $C_1$ will be charged such that its electrode connected to the junction point Q will become negative with respect to the electrode connected to the transistor $T_1$. This charge will continue until the instant $t_2$. Then transistor $T_1$ is turned off and SCR $D_1$ turned on. The turn-on of SCR $D_1$ means that the discharging of capacitor $C_1$ will be accelerated because inductance $L_2$ is now inserted. Thus a new L.C. circuit is formed by $L_2$ and $C_1$. Therefore the voltage $V_Q$ at the point Q will rise rapidly (see FIG. 2(*c*)) until the instant $t_p$ at which instant the current through capacitor $C_1$ is zero. Thereafter the current through capacitor $C_1$ again changes direction. So the voltage $V_Q$ starts to decrease and will be equal to $-V_{cc}$ at the instant $t_3$. This is so because at the instant $t_3$ the current $i_{D1}$ is maximum (see FIG. 2(*d*)) and because current $i_c$ is zero (see FIG. 2(*a*)). The current through capacitor $C_1$ is practically equal to the current $i_{D1}$ (neglecting the small current flowing through $L_1$ at this instant) and also equal to $i_{Ly}$ so that in the resonant circuit, now formed by $L_2$, $C_1$ and $L_y$, the current is maximum and thus the voltage across capacitor $C_1$ and the voltages across inductances $L_y$ and $L_2$ will be zero. Therefore point Q gets the voltage $-V_{cc}$, assuming that the SCR has practically no impedance when turned on. After the instant $t_3$, which is the start of the flyback period, the current will continue to flow through the resonant circuit $L_2$, $C_1$ and $L_y$ whereby the electromagnetic energy stored in inductance $L_y$ during the period $t_0$–$t_3$, will be transferred to electrostatic energy in the capacitor $C_1$. Thus capacitor $C_1$ is once again charged resonantly by energy stored in $L_y$ and, at an instant $t'_4$ (just prior to $t_4$) all this stored energy will have been transferred to capacitor $C_1$ (this is the charged state postulated initially). This resonant charging of $C_1$ occurs during a time period equal to one quarter of the time period of the resonant circuit formed by $L_y$, $L_2$ and $C_1$. The accompanying current flow through the loop circuit $L_y$, $C_1$, $L_2$ and SCR changes sign when $C_1$ is fully charged. Since the SCR cannot conduct in its reverse direction the said current flow would cease at this instant $t'_4$. Thus there is a short initial delay $t'_4$–$t_4$ due to the hole storage effect in the SCR because all the holes are not removed until the time $t_4$. Therefore the instant $t_4 = t_0$ is the effective end of flyback and the start of the next stroke, and $T_1$ is arranged to be then turned on (at its base) by the drive waveform.

With regard to the choice of the value of $C_1$ and $L_2$, the period of the tuned circuit $L_y$, $L_2$, $C_1$ was given generally as four, or approximately four, times the desired flyback period. This is of special importance as will be seen from FIG. 2(*b*), because with this choice of the tuned circuit $L_y$, $L_2$, $C_1$, the rise of the collector voltage $V_c$, starting at the instant $t_3$ was not very steep, and this rise would be much steeper if the period of the tuned circuit $L_y$, $L_2$, $C_1$ was chosen to be two times the desired flyback period.

In the present specific example, the period chosen for the tuned circuit $L_y$, $L_2$, $C_1$ (which is equal to four times the period $t_3-t'_4$) is less than four times $t_3-t_4$ in order to accommodate the turn-off delay of the SCR due to hole storage.

The said delay in the SCR turn-off has an effect in that $C_1$ discharges back into $L_y$ between instants $t'_4$ and $t_4$ thus causing a small current in $L_y$ in a direction opposite to that which would be produced by a supply-voltage $V_{cc}$ through $T_1$. The new current stroke starts from this level of inverse current which flows through transistor $T_1$ (see FIG. 2(*a*)) by virtue of the transistor being capable of conducting in its reverse direction with its emitter-collector section operating as a forwardly conducting diode while the inverse current lasts.

It may be added that throughout the scanning period the circuit $T_1$, $C_1$, $L_1$ will carry a current (which to a first approximation may be regarded as constant) which will be in the forward direction of current flow through the transistor. This current will back off the said initial inverse current but it is found in practice that there remains a residual inverse current flow through the transistor.

In conclusion, it will be seen from FIGS. 2(*a*) and 2(*b*) that, although voltage is present across the transistor in the flyback period $t_3-t_4$, there is no current flow so that there is substantially no power dissipation in the transistor during flyback time.

Even if the transistor current was not exactly zero at the instant $t_3$, the transistor dissipation will be low because the collector voltage $V_c$ is only rising slowly from the instant $t_3$ (see FIG. 2(*b*)).

This is due to the fact that the take-over period $t_2-t_3$ is chosen before the flyback period $t_3-t_4$. This is possible because two switching elements are used which can be switched by means of the same impulses I which are applied to the drive means (transformer with windings P, $S_1$ and $S_2$) with such polarities to both switching elements that the transistor $T_1$ is turned off at the instant the SCR $D_1$ is turned on. So not only the hole storage effect of transistor $T_1$ is eliminated but also its total dissipation is reduced.

The A.C. voltage for the display tube E.H.T. can readily be obtained in a conventional manner by connecting a step-up transformer in parallel with the scanning inductance $L_y$. However, the circuit arrangement of FIG. 1 can be slightly modified to desaturate the core of the EHT transformer and thereby provides a substantial economy in the core volume.

Figure 3:
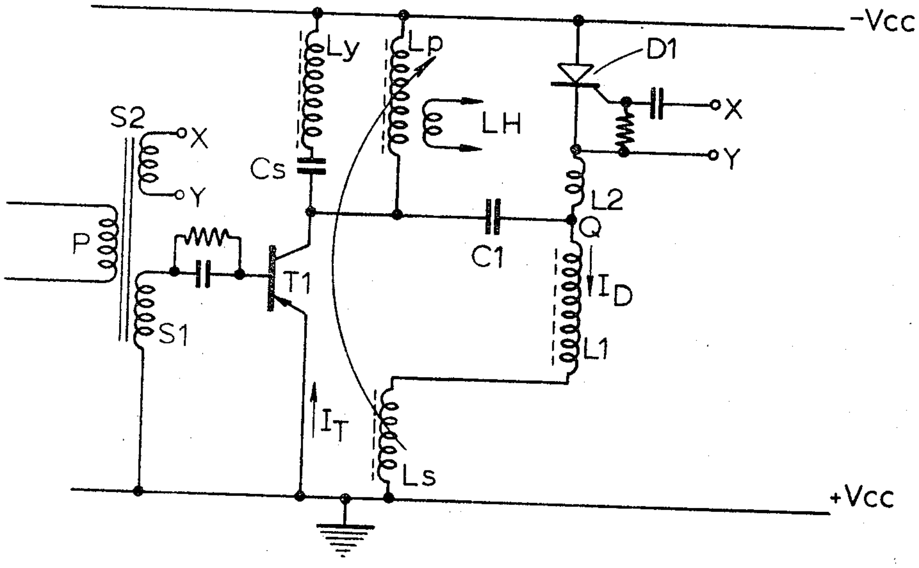
FIG. 3 is an improved embodiment of the circuit arrangement of FIG. 1, which includes an EHT transformer and a core desaturation technique.

In FIG. 3 the primary $L_p$ of the EHT transformer having n.p. turns is connected in parallel with the series connection of scanning inductance $L_y$ and capacitor $C_s$. An object of the capacitor $C_s$ is to introduce a small S-shaped wave correction on the linear saw-toothed scanning wave to correct the scanning non-linearity caused by a substantially flat-faced display tube.

It also obviates picture shift by removing the D.C. component from the coils $L_y$.

The inductance $L_1$ of FIG. 1 includes the series combination of a further inductance $L_s$ having n.s. turns.

As a result, all the D.C. current flows through the EHT primary $L_p$ and tends to saturate its core. This is prevented by the inclusion of the additional winding $L_s$ in which the number of turns thereof is chosen so that n.s.$\times I_D$ equals n.p.$\times I_T$. The winding $L_H$ constitutes the secondary of the EHT transformer which, after conventional rectification and smoothing, supplies the EHT voltage to the final accelerating electrode of the display tube.

Because of the voltage developed across $L_s$ during the scanning period, the inductance value of $L_1$ will have to be slightly changed in order to achieve the same circuit function.

The arrangement of FIG. 1 may, for example, employ the following set of components and values suitable for a 625-line system having a total line cycle time of 64 $\mu$s.:

*Table*

| | | |
|---|---|---|
| Supply $V_{cc}$ | volts | 12 |
| Period $t_2-t_3$ | $\mu$s | 4 |
| Period $t_3-t_4$ | $\mu$s | 14.5 |
| Transistor $T_1$ | | Mullard type AU 101 |
| SCR $D_1$ | | General Electric C 36 D |
| Inductance $L_y$ | $\mu$h | 97 |
| Inductance $L_1$ | mh | 12 |
| Inductance $L_2$ | $\mu$h | 17 |
| Capacitance $C_1$ | $\mu$f | 0.42 |

What is claimed is:

1. A circuit for generating a saw-tooth deflection current having a given flyback period in a deflection coil, comprising first and second switching elements of the semiconductor type, a source of supply voltage having two terminals, drive means for delivering signals to turn on and off at least one of said switching elements, an overswing coil and a supply impedance, first means connecting said first switching element in series with said deflection coil across said two terminals of said supply source, second means connecting said second switching element in series circuit with said overswing coil, third means connecting said series circuit in series with said supply impedance across said two terminals of said source so that the free end of the series circuit comprising said second switching element and overswing coil is connected to the other terminal of the supply source than that to which the first switching element is connected, said first connecting means being arranged to form a first junction between the first switching element and deflection coil, said third connecting means being arranged to form a second junction between said supply impedance and said series circuit, A.C. coupling means interconnecting said first and second junctions, characterized in that the first switching element is a transistor, poled in the forward direction with respect to the polarity of the voltage delivered by the supply source, and the second switching element is a controlled rectifier poled in the reverse direction with respect to the polarity of the voltage delivered by the supply source, said drive means being arranged to deliver a first drive signal to turn off the transistor before the end of a scanning stroke and turn it on at the beginning of the scanning stroke and a second drive signal to turn on said controlled rectifier at the instant the transistor is turned off.

2. A circuit arrangement as claimed in claim 1, wherein said A.C. coupling means is a capacitor, characterized in that said capacitor in conjunction with the deflection coil and the overswing coil form a flyback circuit having a period approximately equal to four times said flyback period.

3. A circuit arrangement as claimed in claim 2, wherein the time period between the turn-off of the transistor and the beginning of the flyback period is equal to one-half of the period of the resonant circuit formed by said coupling capacitor and said overswing coil, said time period being substantially equal to the time necesary to drive the holes out of the base region of transistor by means of said first drive signal when turning off said transistor.

4. A circuit arrangment as claimed in claim 1, wherein said drive means comprise a transformer having one primary and two secondary windings, means for supplying to said primary winding a drive signal, means connecting the first secondary winding to the control electrode of the transistor for delivering thereto said first drive signal, and means connecting the second secondary winding to the control electrode of the controlled rectifier for delivering thereto said second drive signal.

5. A circuit arrangement as claimed in claim 1, further comprising means for generating an A.C. voltage for the EHT supply to the display tube, said voltage generating means comprising a capacitor effectively connected in series with the deflection coil, means connecting the primary winding of an EHT step-up transformer across said series combination, means connecting a further inductance in series with the supply impedance which is connected in series with the controlled rectifier, wherein said further inductance is magneticaly coupled to said EHT primary winding, the turns ratio of the EHT primary winding and the further inductance being chosen so as to substantially desaturate the core of said EHT transformer.

6. A circuit for generating an alternating current of sawtooth waveform in an inductive load comprising, a source of direct voltage, a first series circuit connected across said voltage source comprising said inductive load and semiconductor amplifier means having a control electrode for controlling the current flow therein, a second series circuit connected across said voltage source comprising a controlled rectifier having a gate electrode and connected in series with an inductance and impedance means, said semiconductor amplifier means being poled in the forward direction with respect to said voltage source and said controlled rectifier being poled in the reverse direction with respect to said voltage source, a capacitor interconnecting said first and second series circuits to form first and second closed loop circuits, said first closed loop circuit comprising, in series, said inductive load, said controlled rectifier, said inductance and said capacitor, said second loop comprising, in series, said impedance means, said semiconductor amplifier and said capacitor, and drive means coupled to said control and gate electrodes for simultaneously applying thereto drive signals of a polarity tending to turn off current flow in said semiconductor amplifier and to turn on current flow in said controlled rectifier, respectively.

7. A circuit as described in claim 6, wherein said first closed loop circuit forms a tuned circuit having a period approximately equal to four times the flyback period of said sawtooth alternating current.

8. A circuit as described in claim 6, wherein said drive means is arranged to apply to said control electrode a drive signal tending to turn on current flow in said semiconductor amplifier at the beginning of the stroke period of said sawtooth alternating current, and wherein said second closed loop circuit is arranged to form a tuned circuit having a very long period relative to said stroke period.

9. A circuit as described in claim 6, wherein said drive means is arranged to turn said semiconductor amplifier on and off at least once during each cycle of said sawtooth alternating current, whereby said second closed loop circuit is closed via said semiconductor amplifier during the stroke period thereby to resonantly discharge said capacitor and said first closed loop circuit is closed via said controlled rectifier during the flyback period thereby to resonantly charge said capacitor.

10. A circuit for generating an alternating current of sawtooth waveform in an inductive load comprising, a source of direct voltage, a bridge circuit comprising first and second branches connected across said voltage source, said first branch comprising first and second series-connected arms comprising a transistor poled in the forward direction relative to said voltage source and said inductive load, respectively, said second branch comprising third and fourth series-connected arms, said third arm comprising a supply impedance and said fourth arm comprising, in series, an overswing coil and a controlled rectifier poled in the reverse direction relative to said voltage source, A.C. coupling means connected between the junction of said first and second arms and the junction of said third and fourth arms, signal drive means coupled to the control electrode of said transistor and to the gate electrode of said controlled rectifier, said drive means being arranged to supply a first drive signal to said control electrode to turn said transistor on and off at least once during each cycle of said sawtooth alternating current and to supply a second drive signal to said gate electrode so as to turn on said controlled rectifier at the same time in each cycle that said first drive signal turns off said transistor.

11. A circuit as described in claim 10, wherein said transistor and said controlled rectifier are arrangd in opposed arms of said bridge circuit.

References Cited

UNITED STATES PATENTS 3,210,601 10/1965 Walker ............ 315—27

DAVID G. REDINBAUGH, *Primary Examiner.*

T. A. GALLAGHER, *Assistant Examiner.*